United States Patent
Inoue et al.

[19]

[11] Patent Number: 6,075,401
[45] Date of Patent: Jun. 13, 2000

[54] SWITCHING CIRCUIT AND SWITCHED CAPACITOR

[75] Inventors: Yoshiji Inoue; Yasuhiro Okazaki, both of Tokyo, Japan

[73] Assignees: Mitsubishi Electric Engineering Co., Ltd.; Mitsubishi Denki Kabushiki Kaisha, both of Tokyo, Japan

[21] Appl. No.: 09/103,313

[22] Filed: Jun. 24, 1998

[30] Foreign Application Priority Data

Jan. 9, 1998 [JP] Japan ................... 10-003506

[51] Int. Cl.[7] ............. H03K 17/687; H04B 1/10

[52] U.S. Cl. ............. 327/427; 327/554; 327/589; 327/404

[58] Field of Search ............... 327/437, 427, 327/552, 554, 589, 536, 537, 442, 403, 404

[56] References Cited

U.S. PATENT DOCUMENTS 5,589,793  12/1996  Kassapian .................. 327/536

FOREIGN PATENT DOCUMENTS 4138712  5/1992  Japan .
6343013  12/1994  Japan .
 865108   3/1996  Japan .

*Primary Examiner*—Dinh T. Le
*Attorney, Agent, or Firm*—Leydig, Voit & Mayer

[57] ABSTRACT

A switching circuit operable under a low voltage power source includes first and second level shift circuits. The level shift circuits receive a switching control signal and generate an internal switching signal and an inverted internal switching signal. The level shift circuits supply the internal switching signals to switching elements. A switched capacitor filter includes an amplifier and the described switching circuit. The amplifier has amplification inverters connected in series in three stages.

5 Claims, 6 Drawing Sheets

SWITCHING CIRCUIT AND SWITCHED CAPACITOR

BACKGROUND OF THE INVENTION

1. Field of the Invention

The present invention relates to a switching circuit and a switched capacitor filter fabricated by a complementary metal oxide semiconductor (CMOS) fabrication process that are widely applied to various semiconductor applications, and, more particularly, to a switching circuit and a switched capacitor filter that are operable under a lower voltage, or a low driving voltage and have a low power consumption.

2. Description of the Prior Art

FIG. 1 is a block diagram showing a conventional switched capacitor filter having a basic configuration that has been disclosed by Japanese patent laid-open publication number JP-A-4/138712 and the like. In FIG. 1, the reference character 24 designates an input terminal of the switched capacitor filter to which an input signal is inputted. The reference number 28 denotes an operational amplifier having an inverting input terminal and a non-inverting input terminal. The inverting input terminal receives the input signal transferred from the input terminal 1 and the non-inverting terminal is connected to a ground, namely is grounded. This operational amplifier outputs an inverted amplified signal whose amplitude corresponds to a voltage between the inverting input terminal and the non-inverting input terminal. The reference number 30 indicates an output terminal through which the inverted amplified signal is outputted as the output of the switched capacitor filter. The reference number 29 denotes a fixed capacitor located between the non-inverting input terminal of the operational amplifier 28 and the output terminal 30 in parallel with the operational amplifier 28. The input signal is transferred from the input terminal 24 to the output terminal 30 through signal paths, or through signal channels, formed by the components described above. The reference number 53 designates a connection node of the input side through which the fixed capacitor 29 is connected to the non-inverting input terminal of the operational amplifier 28. The reference number 54 designates a connection node of the output side of the operational amplifier through which the fixed capacitor 29 is connected to the output terminal of the operational amplifier 28.

The reference number 26 designates an input capacitor placed between the connection node 53 of the input side and the input terminal 24. The reference number 25 denotes a first switching circuit, located between the input capacitor 26 and the input terminal 24, for switching the connection between the input capacitor 26 and the input terminal 24 or the ground side of the ground voltage. The reference number 27 designates a second switching circuit, placed between the input capacitor 26 and the connection node 53 of the input side, for switching the connection between the input capacitor 26 and the connection node 53 of the input side or the ground side of the ground voltage.

The reference number 32 denotes a limit capacitor placed between the connection node 53 of the input side and the connection node 54 of the output side.

The reference number 31 designates a third switching circuit, placed between the limit capacitor 32 and the connection node 53 in the input side, for switching the connection between the limit capacitor 32 and the connection node 53 in the input side or the ground side of the ground voltage.

The reference number 33 denotes a fourth switching circuit, located between the limit capacitor 32 and the connection node 54 of the output side, for switching the connection between the limit capacitor 32 and the connection node 54 of the output side or the ground side of the ground voltage. The reference number 1 designates an input terminal to which a switching signal is inputted. The reference number 2 denotes a control inverter for inverting the level of the switching control signal and for outputting the inverted switching control signal having the inverted phase. In the conventional switched capacitor filter having the above configuration, the switching control signal and the inverted switching signal are inputted directly to the switching circuits 25, 27, 31, and 33.

Next, a description will be given of the operation of the conventional switched capacitor filter shown in FIG. 1.

Hereinafter, each of the switching circuits 25, 27, 31, and 33 connects each of the capacitors 26 and 32 to the signal paths of the input signal while the level of the switching control signal is the high level, and each connects each of the capacitors 26 and 32 to the ground voltage while the level of the switching control signal is the low level, where the signal path is formed through the input terminal 24, the connection node of the input side, and the connection node 54 of the output side.

First, when the level of the switching control signal is a level of a low voltage (or a low level), all of the switching circuits 25, 27, 31, and 33 perform so that the input capacitor 26 and the limit capacitor 32 are connected to the level of the ground voltage. Thereby, both terminals of each of the input capacitor 16 and the limit capacitor 36 are short-circuited and both capacitors are discharged completely.

Under the above situation, when the level of the switching control signal is changed to a level of a high voltage (or a high level), all of the switching circuits 25, 27, 31, and 33 perform so that the input capacitor 26 and the limit capacitor 32 are connected to the signal path side. Then, a charging current I2 flows through the input capacitor 26. The magnitude of the charging current I2 corresponds to the voltage difference between the input voltage V1 of the input signal and the voltage V2 at the connection node 53 of the input side. The input capacitor 26 is charged to the voltage difference (V1−V2). Similarly, a charging current I3 flows through the limit capacitor 32. The magnitude of the charging current I3 corresponds to the voltage difference between the voltage V2 at the connection node 53 of the input side and the voltage V3 at the connection node 54 of the output side. Limit capacitor 32 is charged to the voltage difference (V2−V3).

Further, when the level of the switching control signal is changed to the low level again, both terminals of each of the input capacitor 16 and the limit capacitor 36 are short-circuited and both capacitors are discharged completely.

Thereby, those two capacitors 26 and 32 act the circuits through which the charging current flows per period of the switching control signal by the switching operation of the switching circuits 25, 27, 31, and 33 connected to both sides of each of the capacitors 26 and 32. Those capacitors 26 and 32 act as a resistance for an input signal whose frequency is adequately lower than the frequency of the switching control signal.

FIG. 2 is a block diagram showing an equivalent circuit of the switched capacitor filter when the frequency of the switching control signal is adequately high when comparing with the input signal. In FIG. 2, the reference number 46 designates an input equivalent resistance as an equivalent circuit of the input capacitor 26. The reference number 47 denotes a limit equivalent circuit as an equivalent circuit of the limit capacitor 32.

Because other components of the equivalent circuit shown in FIG. 1 are equal to the components of the switched capacitor filter shown in FIG. 1, the same reference numbers of them will be used and the explanation of them is omitted here for brevity.

When the capacitance of the input capacitor 26 is C2, and the capacitance of the limit capacitor 32 is C1, and one period of the switching control signal is Ts, the value of the input equivalent resistance becomes Ts/C2, and the value of the limit equivalent resistance becomes Ts/C1.

In the equivalent circuit of the switched capacitor filter described above, the input current I2 flows when the voltage V1 of the input signal is increased, for example. This input current I2 is obtained by dividing the voltage difference between the input voltage V1 and the voltage V2 at the connection node 53 in the input side by the input equivalent resistance 46 (Ts/C2). This input current I2 flows through one terminal of the fixed capacitor 29 and the limit equivalent resistance 47 (Ts/C1), and the fixed capacitor 29 is thereby charged. At this time, electric charges are supplied to the other terminal of the fixed capacitor 29 from the operational amplifier 28. As a result, the voltage V3 having a reverse polarity capable of amplifying the input voltage V1 is outputted to the output terminal 30 according to the charged voltage of the fixed capacitor 29.

Because the conventional switched capacitor filter has the configuration described above, it is required to have a switching circuit to switch the connection nodes to which the capacitor will be connected. Thereby, it is limited or difficult to decrease the voltage of an electric power source as the driving voltage, and it is thereby difficult to reduce the entire voltage of semiconductor integrated circuit devices.

This drawback of the conventional switched capacitor filter will be explained in detail by using a concrete example.

FIG. 3 is a circuit diagram showing a conventional switching circuit. In FIG. 3, the reference number 8 designates one selection connection terminal of the switching circuit, and 9 denotes other selection connection terminal in this switching circuit. The reference number 10 denotes a common terminal that will be selectively connected to one of the selection connection terminals 8 and 9. The reference number 6 designates a forward switching element comprising a P channel electrical field effect transistor (a P channel FET) and a N channel electrical field effect transistor (a N channel FET). Both sources of the P channel FET and the N channel FET in the forward switching element 6 are connected to each other, and the drains of both FETs are connected to each other. The reference number 7 indicates an inverse switching element comprising a P channel FET and a N channel FET. Similar to both the P channel FET 8 and the N channel FET 9 in the forward switching element 6, both sources of the P channel FET and the N channel FET in the inverse switching circuit 7 are connected to each other and the drains of the P-Channel FET and the N-Channel FET are connected to each other. Because other component elements are the same of the components in the switched capacitor filter shown in FIG. 1, the same reference numbers are used, and the explanation of them is omitted here for brevity.

Next, a description will be given of the operation of the conventional switching circuit shown in FIG. 3.

The source electrode of the forward switching element 6 is connected to the selection connection terminal 8 as one of the selection connection terminals 8 and 9. The drain electrode of the forward switching element 6 is connected to the common terminal 10. The source terminal of the inverse switching element 7 is connected to the selection connection terminal 9, and the drain electrode is connected to the common terminal 10. In addition, the gate electrode of the P channel FET in the forward switching element 6 inputs an inverted switching control signal, and the gate electrode of the N channel FET in the forward switching element 6 inputs a switching control signal, the gate electrode of the P channel FET in the inverse switching element 7 inputs the switching control signal, and the gate electrode of the N channel FET in the inverse switching element 7 inputs the inverted switching control signal.

Next, a description will be given of the operation of the conventional switching circuit shown in FIG. 3.

When the level of the switching control signal is a level of a high voltage (an H level), the gate electrode of the N channel FET in the forward switching element 6 inputs the signal of the H level and the gate electrode of the P channel FET in the forward switching element 6 inputs the signal of the L level, and both two transistors, P channel FET and N channel FET, in the forward switching element 6 are ON. On the contrary, in the above situation, the gate electrode of the N channel FET in the inverse switching element 7 inputs the signal of a low level (L level as a level of a low voltage) and the gate electrode of the P channel FET in the inverse switching element 7 inputs the signal of the H level, both two transistors, P channel FET and N channel FET in the forward switching element 6 are OFF. In this case, the level of the voltage inputted to the selection connection terminal 8 is outputted to the common terminal 10 through the forward switching element 6.

On the other hand, when the level of the switching control signal is the L level, both the P channel FET and the N channel FET in the inverse switching element 7 are ON, so that a level of the voltage inputted to the selection connection terminal 9 is outputted to the common terminal 10 through the inverse switching terminal 10.

Next, a description will be given of the operation of the forward and inverse switching elements 6 and 7.

FIG. 4A is a diagram showing the ON resistance (a resistance between the source electrode and the drain electrode) of the P channel FET to be used in the switching element. As shown in FIG. 4A, the ON resistance of the P channel FET is decreased when the voltage between the source electrode and gate electrode is increased. The ON resistance of this P channel FET may be neglected when the voltage between the source electrode and gate electrode becomes lower than the threshold voltage of this P channel FET measured from the voltage of the high power source. FIG. 4B is a diagram showing the ON resistance (as the resistance between the source electrode and drain electrode) of the N channel FET to be used in the switching circuit. As shown in FIG. 4B, the ON resistance of the N channel FET is decreased when the voltage between the source electrode and gate electrode is increased. The ON resistance of this N channel FET may be neglected when the voltage between the source electrode and gate electrode becomes lower than the threshold voltage of this N channel FET measured from the voltage of the low power source.

FIG. 4C and FIG. 4D are diagrams showing an input voltage Vin and a composite ON resistance of both the P channel FET and N channel FET shown in FIG. 4A and FIG. 4B. That is, FIG. 4C is a diagram showing a case in which the voltage VCC of the high power source is set to a voltage that is not less than the sum voltage (VTHP+VTHN) of both the threshold voltages of the P channel FET and N channel FET. In this case shown in FIG. 4C, the range of the input voltage PFETON where the ON resistance of the P channel FET may be neglected is overlapped (namely, are continued) to the range of the input voltage NFETON where the ON resistance of the N channel FET may be neglected. Accordingly, it is possible to connect the source electrode to the drain electrode without any causing of the ON resistance of one of the P channel FET and N channel FET even if the input voltage Vin is increased in the range from the voltage GND of the lower power source to the voltage VCC of the high power source. When both the P channel FET and N channel FET are used for a switching circuit, there is an effect in which no ON resistance is generated in the voltage range from the low voltage GND of the lower power source to the high voltage VCC of the high power source. As a result, it is possible to provide the input voltage that has been inputted to the source electrode or the drain electrode of the FET to other electrode.

FIG. 4D is a diagram showing a case in which the voltage VCC of the high power source is set to a voltage that is not more than the sum voltage (VTHP+VTHN) of both the threshold voltages of the P channel FET and N channel FET. In this case shown in FIG. 4D, the range of the input voltage PFETON where the ON resistance of the P channel FET may be neglected is separated to the range of the input voltage NFETON where the ON resistance of the N channel FET may be neglected. Accordingly, the ON resistance of each of the P channel FET and N channel FET is generated at the half voltage VCC/2 of the voltage of the high power source and near voltage thereof when the input voltage Vin is changed from the low voltage GND of the low voltage power source to the high voltage VCC of the high voltage power source. As a result, the voltage inputted to the source electrode or the drain electrode is reduced by the ON resistance and the reduced voltage is outputted to other electrode.

As apparent from the foregoing explanation for the conventional switching circuit and the conventional switched capacitor filter, when the switching element performs by using the power source whose voltage is not more than the sum voltage (VTHP+VTHN) of the threshold voltages of both the P channel FET and N channel FET, the P channel FET or the N channel FET in this switching element has the ON resistance, so that it is difficult to output the input voltage as the output without decreasing of the magnitude of the input voltage.

That is, it is possible to operate switching circuits and switched capacitor filters, each of them incorporates the above switching element in the voltage that is not more than the sum voltage of the threshold voltages of both the P channel FET and N channel FET in the switching element. In addition, it is difficult to operate the conventional switched capacitor filter under the lower voltage by other factors.

We will explain this drawback of the conventional switched capacitor filter in the following concrete example.

FIG. 5 is a circuit diagram showing the internal configuration of the operational amplifier 28 incorporated in the conventional switched capacitor filter shown in FIG. 1. In FIG. 5, the reference number 35 designates an input terminal of the operational amplifier 28 to which an inverted input signal is supplied, and 48 denotes a non-inverting input transistor whose gate inputs the inverted input signal is inputted. The reference number 49 indicates a non-inverse input transistor whose gate is connected to the ground voltage and whose source is connected to the source of the inverting input transistor 48. The reference number 50 designates a current source transistor placed between the source electrodes of both the transistors 48 and 49 and the ground voltage, and for limiting the sum of currents flowing through those transistors 48 and 49.

The reference number 51 designates a first load transistor placed between the drain electrode of the inverse input transistor 48 and the high voltage power source. The reference number 52 denotes a second load transistor placed between the drain electrode of the non-inverse input transistor 49 and the high voltage power source. The reference number 36 indicates an amplifier output terminal connected to the drain electrode of the first load transistor 51. The drain electrode of the second load transistor 52 is connected to the gate electrode of the first load transistor 51.

Next, a description will be given of the operation of the operational amplifier 28.

For example, when the level of the voltage to be inputted to the input terminal 35 of the amplifier is increased, the magnitude of the current flowing between the source electrode and drain electrode in the inverting input transistor 48 is increased. Because the magnitude of the sum current between a differential current flowing through the inverting input transistor 48 and a differential current flowing through the non-inverting input transistor 49 is limited by the power source transistor 50, the magnitude of the differential current flowing through the non-inverting input transistor 49 is decreased. Accordingly, the magnitude of the current flowing through the second load transistor 52 is also decreased, so that the magnitude of the voltage in the second load transistor 52 is decreased. This results in magnitude imbalance between both the output current of the first load transistor 51 and the input current of the inverse input transistor 48, and the differential current between both the currents is provided by other circuits (omitted from FIG. 5) connected to the operational amplifier 28.

On the contrary, when the magnitude of the voltage to be inputted to the input terminal 35 of the operational amplifier is decreased, the differential current flows through the output terminal 36 in the operational amplifier 28. In the operational amplifier 28 performing the above operation, because the P channel FETs and the two N channel FETs are placed between the high voltage power source and the low voltage power source in three stages, it must be required to use a power source whose voltage is not less than the sum voltage between the threshold voltages of those three FETs. Accordingly, the conventional switched capacitor filter requires the power source whose voltage is not less than the sum of the three threshold voltages of those FETs. Therefore the conventional switched capacitor filter has the drawback that it is difficult to operate the conventional switched capacitor filter by using the power source whose voltage is not more than the sum of the threshold voltages of two FETs selected in the three FETs even if operational voltage of the current source transistor is adjusted.

SUMMARY OF THE INVENTION

Accordingly, an object of the present invention is, with due consideration to the drawbacks of the conventional technique, to provide a switching circuit comprising two FETs and a switched capacitor filter capable of performing under the low voltage of a voltage power source which is not more than the sum of threshold voltages of both the two FETs, and the switching circuit and the switched capacitor filter capable of reducing the power consumption.

In accordance with a preferred embodiment of the present invention, a switching circuit comprises a forward switching circuit comprising a P channel field effect transistor (FET) and a N channel FET, whose source electrodes are connected to each other, and whose drain electrodes are also connected to each other, a first level shift circuit for receiving a switching control signal and for generating an internal switching signal whose phase is equal to a phase of the switching control signal and whose amplitude is larger than an amplitude of the switching control signal, and a second level shift circuit for receiving the switching control signal and for generating an inverted internal switching signal whose phase is an opposite phase to the phase of the switching control signal, and whose amplitude is larger than the amplitude of the switching control signal. In the above switching circuit, the internal switching signal is inputted to a gate electrode of one FET in the P channel FET and the N channel FET in the forward switching element, and the inverted internal switching signal is inputted to a gate electrode of other FET in the P channel FET and the N channel FET in the forward switching element.

The switching circuit described above as another preferred embodiment according to the present invention, further comprises an inverse switching element comprising a P channel FET and a N channel FET, whose source electrodes are connected to each other and whose drain electrodes are connected to each other. In the inverse switching element in the above switching circuit, the internal switching signal is inputted to a gate electrode of one FET, in different channel from one FET in the forward switching element, in the P channel FET and the N channel FET in the forward switching element, and the inverted internal switching signal is inputted to a gate electrode of other FET, it is also in different channel from other FET in the forward switching element, in the P channel FET and the N channel FET in the forward switching element.

In the switching circuit described above as another preferred embodiment according to the present invention, each of the first level shift circuit and the second level shift circuit comprises a shift voltage generation circuit for generating a shift voltage based on a voltage of a voltage power source, a shift capacitor to be charged by the shift voltage generation circuit according to the shift voltage, a charging switch circuit for connecting the shift capacitor to the shift voltage generation circuit, a shift output voltage generation circuit for generating a shift output voltage by connecting one terminal of the shift capacitor to the voltage power source when the shift capacitor is electrically disconnected from the shift voltage generation circuit according to the switching control signal, and an internal switching signal generation circuit for generating an internal switching signal and an inverted internal switching signal by using the shift output voltage and the voltage of the voltage power source according to the switching control signal.

In the switching circuit described above as another preferred embodiment according to the present invention, the shift output voltage generation circuit comprises a field effect transistor, and the shift voltage generation circuit generates the shift output voltage that is smaller in magnitude than a forward voltage generated in a diode formed between the field effect transistor and a semiconductor substrate.

In accordance with another preferred embodiment according to the present invention, a switched capacitor filter comprises an input terminal for receiving an input signal, an amplifier for amplifying the input signal, for inverting the amplified input signal, and for outputting the inverted amplified input signal to an output terminal of the switched capacitor filter, a fixed capacitor placed in parallel to the amplifier between the input terminal and the output terminal, an input capacitor placed at a signal line between the input terminal and the output terminal and placed at an upper stream side observed from the fixed capacitor and the amplifier on the signal line, and the switching circuit as claimed in claim 1 for switching an electrical connection of the input capacitor to one of the amplifier and a first voltage power source.

In the switched capacitor filter described above as another preferred embodiment according to the present invention, the amplifier comprises a plurality of amplification inverters connected in series in odd-number stages placed on the signal line between the input terminal and the output terminal. In addition, in the switched capacitor filter, each of the plurality of amplification inverters forming the amplifier comprises an amplification field effect transistor whose source electrode is connected to the first voltage power source and whose gate electrode inputs the input signal or a signal corresponding to the input signal, and a current source field effect transistor placed between the drain electrode of the amplification field effect transistor and a second voltage power source, for limiting a magnitude of a current flowing through the amplification field effect transistor.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of the switching circuit and the switched capacitor filter according to the present invention will now be described with reference to the drawings.

First embodiment

Figure 1:
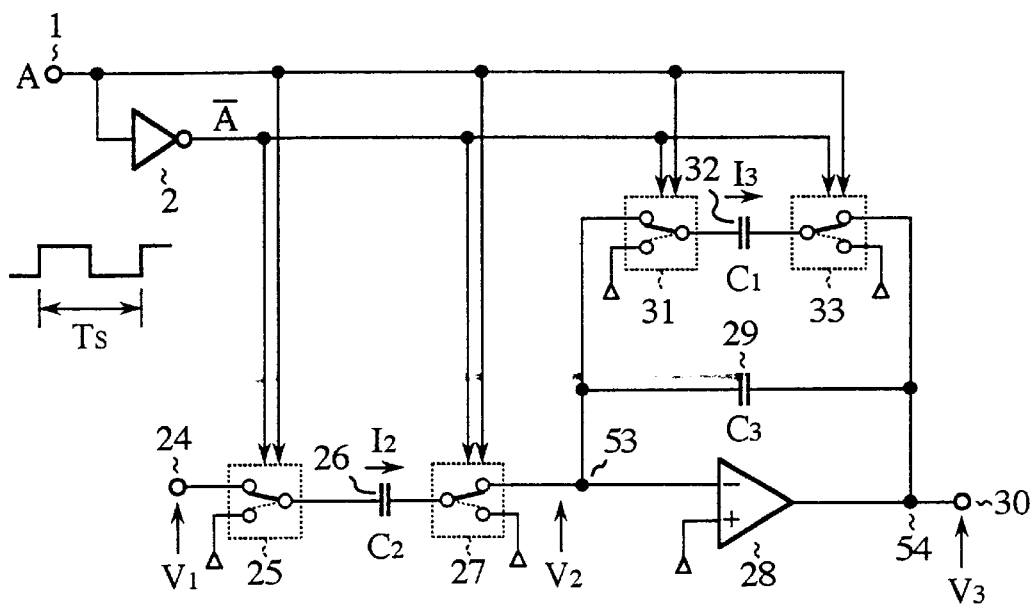
FIG. 1 is a block diagram showing a conventional switched capacitor filter.
Figure 2:
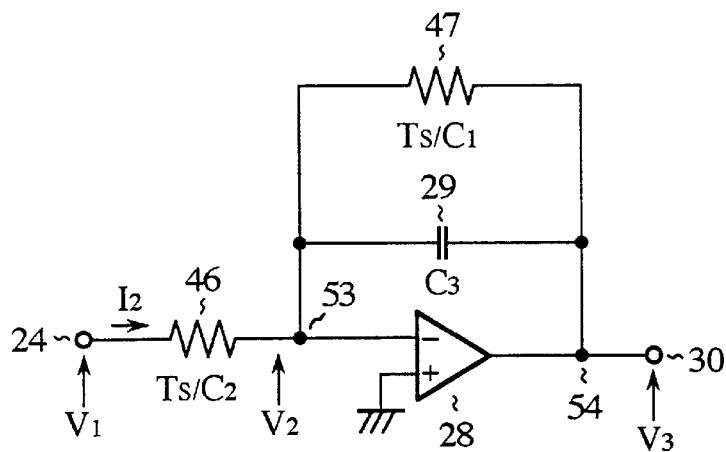
FIG. 2 is a block diagram showing an equivalent circuit of the switched capacitor filter.
Figure 3:
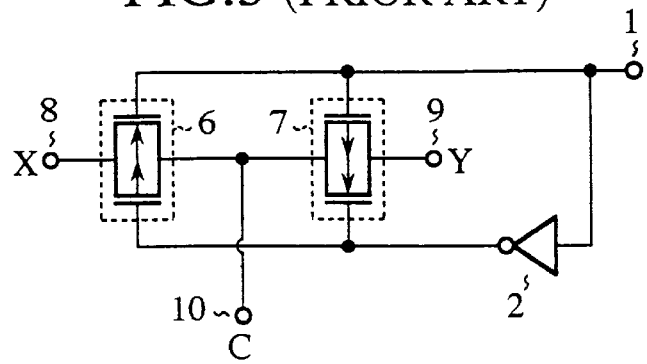
FIG. 3 is a circuit diagram showing a conventional switching circuit.
Figure 4A:
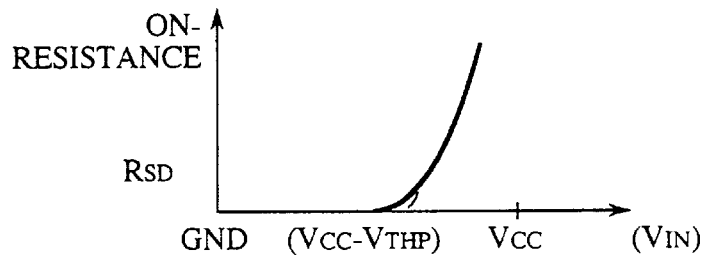
FIG. 4A is a diagram showing the ON resistance (a resistance between the source electrode and the drain electrode) of the P channel FET to be used in the switching element.
Figure 4B:
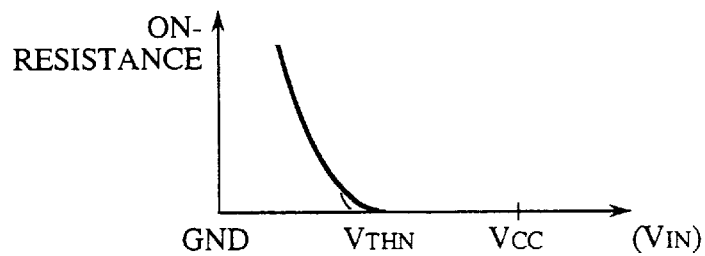
FIG. 4B is a diagram showing the ON resistance (as the resistance between the source electrode and drain electrode) of the N channel FET to be used in the switching circuit.
Figure 4C:
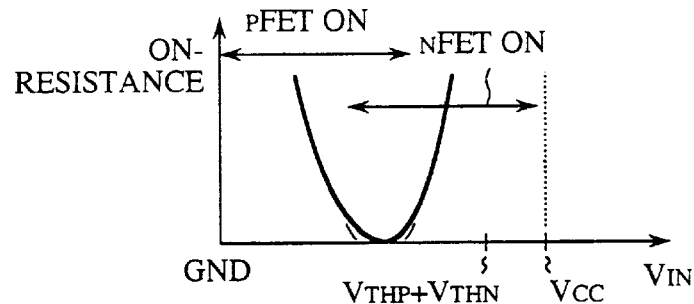
FIG. 4C is a diagram showing a case in which the voltage VCC of the high power source is set to a voltage more than the sum voltage (VTHP+VTHN) of both the threshold voltages of the P channel FET and N channel FET.
Figure 4D:
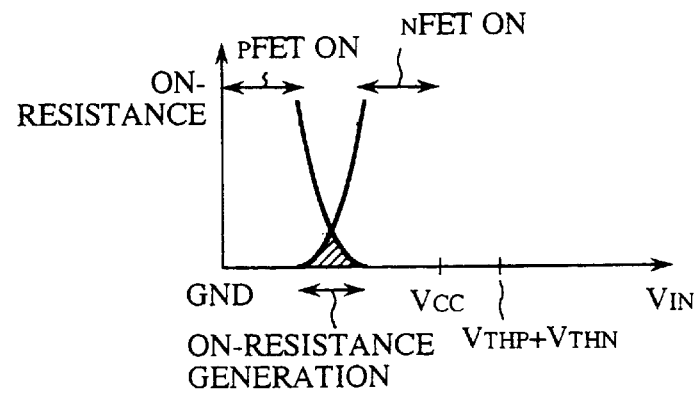
FIG. 4D is a diagram showing a case in which the voltage VCC of the high power source is set to a voltage less than the sum voltage (VTHP+VTHN) of both the threshold voltages of the P channel FET and N channel FET.
Figure 5:
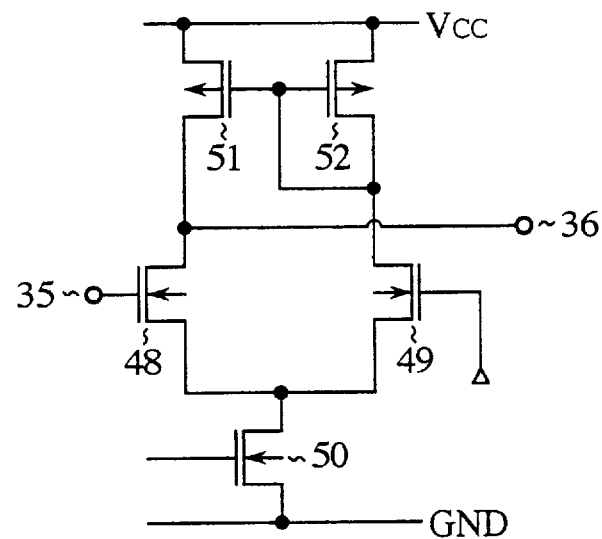
FIG. 5 is a circuit diagram showing an internal configuration of an operational amplifier incorporated in the conventional switched capacitor filter shown in FIG. 1.
Figure 6:
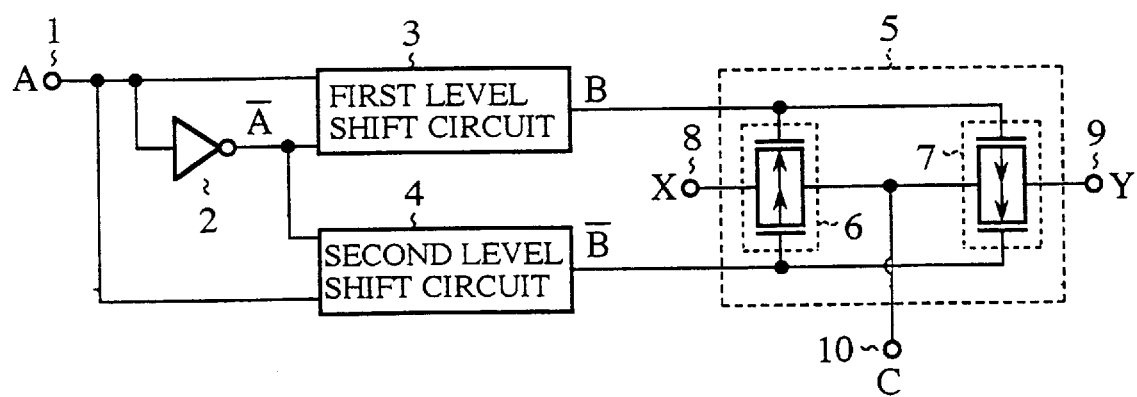
FIG. 6 is a block diagram showing a configuration of a switching circuit as the first embodiment according to the present invention.

FIG. 6 is a block diagram showing the configuration of the switching circuit as the first embodiment according to the present invention. In FIG. 6, the reference number 1 designates a switching signal input terminal to which a switching control signal A is inputted. The reference number 2 denotes an inverter for use in a control operation for the switching control signal A. The inverter 2 performs an inverting operation for the switching control signal A and outputs the inverted switching control signal $\overline{A}$. The reference number 3 designates a first level shift circuit to which both the switching control signal A and the inverted switching control signal $\overline{A}$ are inputted. The first level shift circuit 3 generates an internal switching signal B whose amplitude is greater than that of the switching control signal A and whose phase is equal to that of the switching control signal A. The reference number 4 indicates a second level shift circuit to which both the switching control signal A and the inverted switching control signal $\overline{A}$ are inputted. The second level shift circuit 4 generates an inverted internal switching signal $\overline{B}$ whose amplitude is greater than that of the switching control signal A and whose phase is inverted to that of the switching control signal A. The reference numbers 8 and 9 denote selection connection terminals, 10 indicates a common terminal, and 5 designates a switching circuit for selecting one of the selection connection terminals 8 and 9 and then connecting the selected one to the common terminal 10 according to the switching control signal A and the inverted switching control signal $\overline{A}$. The reference number 6 designates a forward switching element comprising a P channel field effect transistor (a P channel FET) and a N channel field effect transistor (a N channel FET) whose source electrodes are connected to each other and whose drain electrodes are also connected to each other. The gate electrode of the N channel FET receives the internal switching signal B and the gate electrode of the P channel FET receives the inverted switching signal $\overline{B}$. The reference number 7 denotes an inverse switching element comprising a P channel FET and a N channel FET whose source electrodes are connected to each other and whose drain electrodes are also connected to each other. The gate electrode of the P channel FET inputs the internal switching signal B and the gate electrode of the N channel FET inputs the internal inverted switching signal $\overline{A}$.

Figure 7:
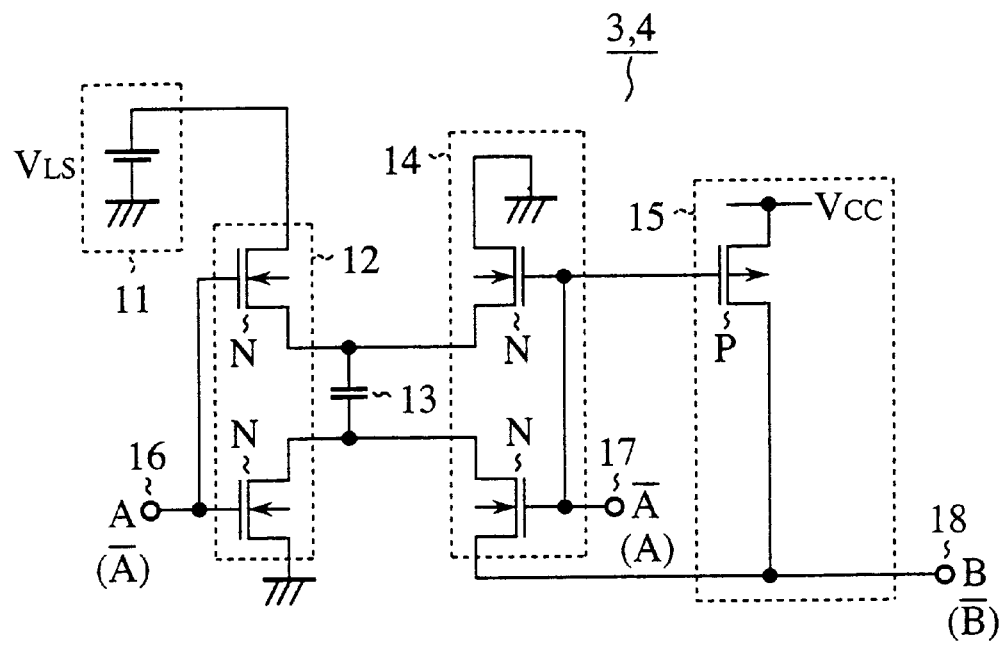
FIG. 7 is a block diagram showing an internal configuration of each of level shift circuits as the first embodiment according to the present invention.

FIG. 7 is a block diagram showing the internal configuration of each of the first and second level shift circuits 3 and 4 as the first embodiment according to the present invention. In FIG. 7, the reference number 16 designates a control input terminal to which the switching control signal A is inputted when it is the first level shift circuit 3, and to which the inverted switching control signal $\overline{A}$ is inputted when it is the second level shift circuit 4. The reference number 17 denotes a voltage generation control input terminal to which the inverted switching control signal $\overline{A}$ is inputted, and the level of this switching control signal is opposite to the level of the switching control signal A to be inputted to the charging control input terminal 16. The reference number 18 indicates an internal switching signal output terminal from which the internal switching signal B is outputted when it is the first level shift circuit 3, and from which the inverted internal switching signal $\overline{B}$ is outputted when it is the second level shift circuit 4.

The reference number 11 designates a shift voltage generation circuit for generating a shift voltage VLS based on the voltage of the power source. The reference number 13 denotes a shift capacitor that is charged by the shift voltage VLS, and 12 indicates a charging switch circuit for electrically connecting the shift capacitor 13 to the shift voltage generation circuit 11 according to the voltage inputted to the charging control input terminal 16. The reference number 14 designates a shift output voltage generation circuit for connecting a high voltage charging terminal of the shift capacitor 13 to the ground voltage potential according to the voltage inputted to the voltage generation control input terminal 17 so as to generate a shift output voltage (−VLS) that is lower than the ground voltage potential. The reference number 15 designates an internal switching signal generation circuit for outputting the shift output voltage (−VLS) to the internal switching signal output terminal according to the level of the voltage generation control input terminal 17. Specifically, in FIG. 7, the FET designated by the reference character P is a P channel FET, and the reference character N is an N channel FET.

Next, a description will be given of the operation of the switching circuit as the first embodiment shown in FIG. 6.

First, when the level of the switching control signal is a High voltage level (an H level), in the first level shift circuit 3, the charging switching circuit 12 connects the shift voltage generation circuit 11 to the shift capacitor 13. As a result, the shift capacitor is charged to the shift voltage VLS. In this case, because the level of the voltage generation control input terminal 17 is set to a low voltage level (a L level), the voltage of the high voltage power source is outputted from the internal switching signal output terminal 18.

In this situation, when the switching control signal is switched to the L level from the H level, the charging switching circuit 14 electrically disconnects the shift voltage generation circuit 14 from the shift capacitor 13. On the other hand, because the level of the voltage at the voltage generation control input terminal 17 is switched to the H level, the shift voltage generation circuit 11 generates a shift output voltage that is lower than the level of the ground voltage by the shift voltage VLS by the shift capacitor 13. In addition to this, the internal switching signal generation circuit 15 outputs the shift output voltage through the internal switching signal output terminal.

On the other hand, by contrast to the first level shift circuit 3 because the second level shift circuit 4 inputs the switching control signal A and the inverted switching control signal $\overline{A}$, the internal switching signal output terminal 18 outputs the inverted internal switching signal $\overline{B}$ whose phase is inverted when comparing with the phase of the internal switching signal B used in the first level shift circuit 3.

Figure 8:
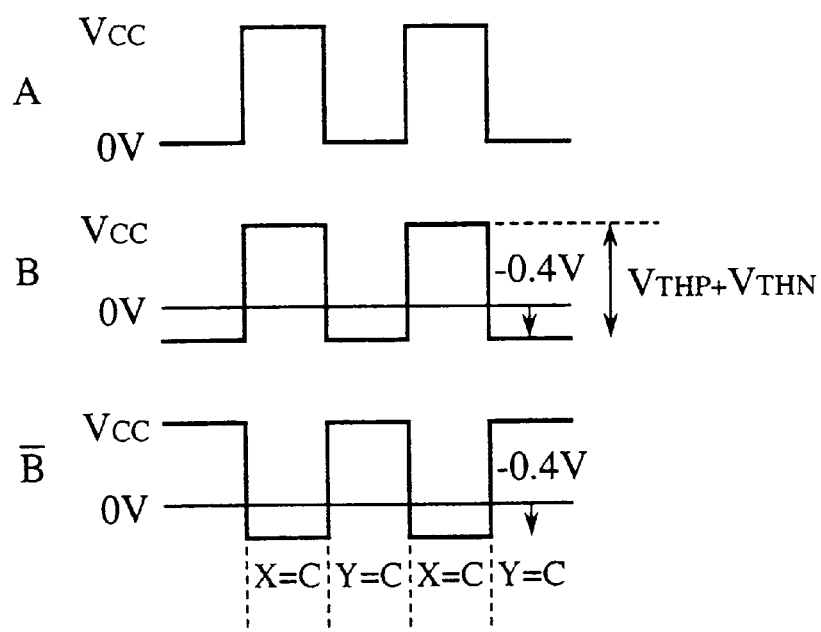
FIG. 8 is a timing chart showing a timing relationship among switching signals used in the first embodiment according to the present invention.

FIG. 8 is a timing chart showing the timing relationship among the switching signals and the internal switching signals generated by the first level shift circuit 3 and the second level shift circuit 4.

In FIG. 8, the reference character A designates the switching control signal, and B denotes the internal switching signal, and $\overline{B}$ indicates the inverted internal switching signal. As shown in FIG. 8, the internal switching signal B has the same phase of the switching control signal A. On the other hand, the phase of the inverted internal switching signal is changed to the opposite phase when compared with the phase of the switching control signal A. Further, the switching control signal A is changed in level during from the voltage VCC to the ground voltage GND. On the contrary, the internal switching signal B and the inverted internal switching signal $\overline{B}$ are changed in level during from the voltage VCC to the voltage –VLS.

The internal switching signal and the inverted internal switching signal generated by the above manner are provided to the forward switching element 6 and the inverse switching element 7 in the switching circuit 5.

As a result, in the forward switching element 6 in which the internal switching signal B is inputted to the N channel FET, because the gate electrode of the P channel FET inputs the L level signal when the level of the internal switching signal B is the H level, both of the two FETs are ON, so that the selection connection terminal 8 is electrically connected to the common terminal 10. At this time, in the inverse switching element 7, the gate electrode of the N channel FET inputs the L level signal, and the gate electrode of the P channel FET inputs the H level signal, both two FETs become OFF.

Conversely, when the level of the internal switching signal B is the L level, in the forward switching element 6, because the gate electrode of the N channel FET inputs the L level signal and the gate of the P channel FET inputs the H level signal, both the P channel FET and the N channel FET become OFF. At this time, in the inverse switching element 7, the gate electrode of the P channel FET inputs the L level, and both FETs are ON, so that the selection connection terminal 9 is electrically connected to the common terminal 10.

As described above, according to the switching circuit of the first embodiment, because it is possible to operate the forward switching element 6 and the inverse switching element 7 alternatingly by using the internal switching signal B and the inverted internal switching signal $\overline{B}$ generated by the switching control signal A, it is possible to connect the selection connection terminals 8 and 9 alternatingly to the common terminal 10. Accordingly, it is possible to use the switching circuit of the first embodiment as a three terminal switching circuit.

In addition, in the switching circuit of the first embodiment, because the two level shift circuits 3 and 4 are incorporated to generate the shift output voltage (–VLS) whose voltage is lower than the voltage of the ground voltage and because the internal switching signal B and the inverted internal switching signal $\overline{B}$ are changed during the range from the shift output voltage (–VLS) to the voltage of the H voltage of the high voltage power source, even if the voltage of the power source is lower than the sum voltage (VTHP+VTHN) of the two FETs used in each of the switching elements 6 and 7, it is possible to supply a voltage that is higher than the sum voltage (VTHP+VTHN) when the switching elements 6 and 7 become ON. Therefore, during the conductive state of the FETs, namely, the ON state, it is possible to sum the voltage ranges of the two FETs used in the switching elements 6 and 7 in which it is possible to neglect the ON resistance of those two FETs. Thereby, it is possible to avoid the voltage drop between each of the selection connection terminals 8 and 9 and the common terminal 10. Accordingly, it is possible to operate the switching circuit of the first embodiment under a low voltage that is lower than the voltage VCC of the power source by the shift output voltage (–VLS). This results in driving the switching circuit under a lower voltage and achieving a low power consumption of the switching circuit.

Second embodiment

Figure 9:
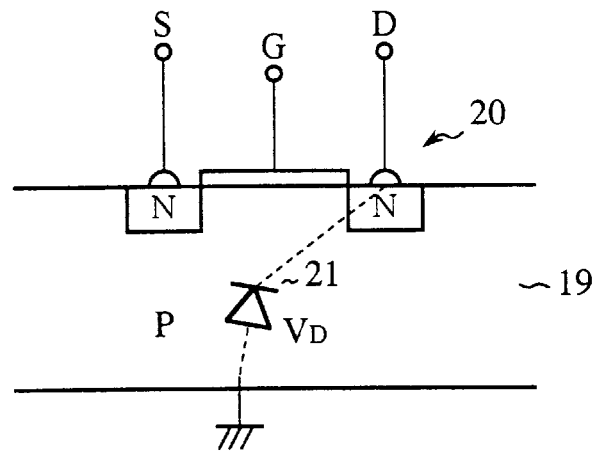
FIG. 9 is a sectional diagram showing a cross section of a semiconductor integrated circuit in which switching circuit is integrated as the second embodiment according to the present invention.

FIG. 9 is a sectional diagram showing a cross section of a semiconductor integrated circuit in which the switching circuit is fabricated as the second embodiment according to the present invention. In FIG. 9, the reference number 19 designates a P conductivity type semiconductor substrate, or a P type semiconductor substrate, and 20 denotes a N channel FET formed on the P type semiconductor substrate 19. The switching circuit comprises the N channel FET formed on the P type semiconductor substrate 19. The circuit configuration of the switching circuit of the third embodiment is the same as the switching circuit as the first embodiment. In the second embodiment, the P type semiconductor substrate 20 is grounded, and a diode 21 is formed between the N channel FET 20 and the P type semiconductor substrate 19. Accordingly, it is possible to generate the voltage of 0.4 V that is lower than the forward voltage in the diode 21.

As described above, according to the switching circuit as the second embodiment having the configuration described above, because the shift voltage is set to the voltage of 0.4 V that is lower than the forward voltage in the diode 21, it is possible to avoid a large current flow, that is not required for operation, from the P type semiconductor substrate 19 to the N channel FET 20 when the shift output voltage (–VLS) is generated by the shift capacitor 13. Thereby, it is possible to avoid causing of an electric breakdown and generation of noise. Furthermore, it is thereby possible to provide the switching circuit having a low power consumption current that may be fabricated by a CMOS processes.

Third embodiment

Figure 10:
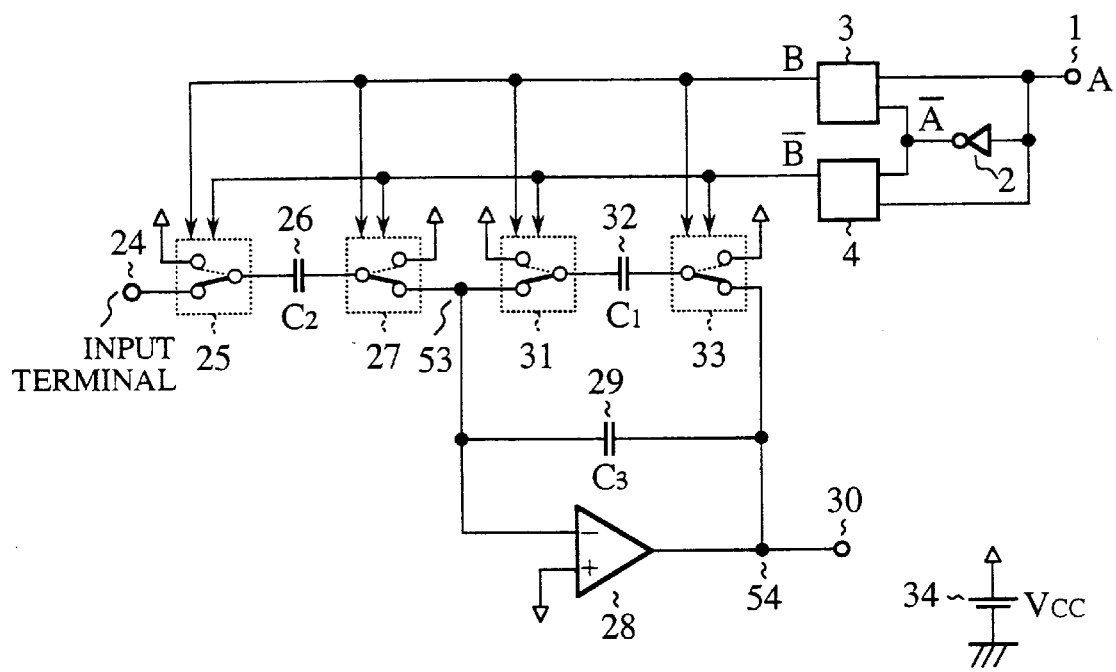
FIG. 10 is a block diagram showing a configuration of a switched capacitor filter as the third embodiment according to the present invention.

FIG. 10 is a block diagram showing the configuration of the switched capacitor filter as the third embodiment according to the present invention. This switched capacitor filter is fabricated as a semiconductor integrated circuit by CMOS process. In FIG. 10, the reference number 24 designates an input terminal of the switched capacitor filter to which an input signal is inputted. The reference number 28 denotes an amplifier. The amplifier 28 has an inverting input terminal and an non-inverting input terminal. The inverting input terminal inputs the input signal from the input terminal 24 and the non-inverting input terminal is grounded. The amplifier 28 outputs an inverted amplified signal having an amplitude according to the voltage between the two terminals, namely the inverting input terminal and the non-inverting input terminal. The reference number 30 designates an output terminal through which the inverted amplified signal is outputted as the output of the switched capacitor filter. The reference number 29 denotes a fixed capacitor placed between the non-inverting input terminal and the output terminal 30. The fixed capacitor 29 is also connected in parallel with the amplifier 28. Thus, the input signal is transferred from the input terminal 24 to the output terminal 30 through the above signal paths, or channels. The reference number 53 denotes an input connection node through which the fixed capacitor 29 is connected to the non-inverting input terminal of the amplifier 28. The reference number 54 indicates an output connection node through which the fixed capacitor 29 is connected to the output terminal of the amplifier 28. The reference number 34 designates a power source for supplying the voltage VCC of a predetermined voltage power source through electrical signal lines to the semiconductor integrated circuit. The reference number 26 denotes an input capacitor placed between the input connection node 53 and the input terminal 24. The reference number 25 denotes a first switching circuit, placed between the input capacitor 26 and the input terminal 24, for switching the connection of the input capacitor 26 to one of the input terminal 24 and the voltage VCC of the high power source. The reference number 27 denotes a second switching circuit, placed between the input capacitor 26 and the input connection node 53, for switching the connection of the input capacitor 26 to one of the input connection node 53 and the voltage VCC of the high voltage power source. The reference number 32 designates a limit capacitor placed between the input connection node 53 and the output connection node 54. The reference number 31 denotes a third switching circuit, placed between the limit capacitor 32 and the input connection node 53, for switching the connection of the limit capacitor 32 to one of the input connection node 53 and the voltage VCC of the high voltage power source. The reference number 33 designates a fourth switching circuit, placed between the limit capacitor 32 and the output connection node 54, for switching the connection of the limit capacitor 32 to one of the output connection node 54 and the voltage VCC of the high voltage power source. The reference number 1 designates an input terminal for inputting the switching control signal A, and 2 denotes a control inverter for inverting the level of the switching control signal A and for outputting the inverted switching control signal $\overline{A}$ whose phase is opposite to the phase of the switching control signal. The reference number 3 indicates a first level shift circuit for inputting the switching control signal A and the inverted switching control signal $\overline{A}$ and for generating the internal switching signal B whose amplitude is larger than the amplitude of the switching control signal A and whose phase is the same as that of the switching control signal A. The reference number 4 denotes a second level shift circuit for inputting the switching control signal A and the inverted switching control signal $\overline{A}$ and for generating the inverted internal switching signal $\overline{B}$ whose amplitude is larger than the amplitude of the switching control signal A and whose phase is opposite to the phase of the switching control signal A. In addition, the internal switching signal B and the inverted switching signal $\overline{B}$ are inputted to the switching circuits 25, 27, 31, and 33.

Figure 11:
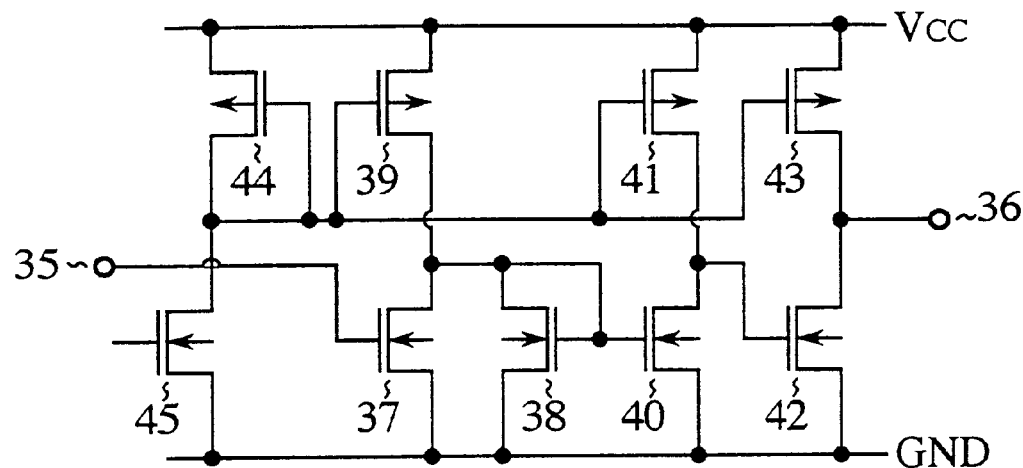
FIG. 11 is a circuit diagram showing an internal configuration of an amplifier as the third embodiment according to the present invention.

FIG. 11 is a circuit diagram showing the internal configuration of the amplifier 28 as the third embodiment according to the present invention. In FIG. 11, the reference number 35 designates an amplifier input terminal for inputting an input signal for the amplifier 28, and 36 denotes an amplifier output terminal for outputting an inverted amplified signal of the amplifier 28. The reference number 37 designates a first amplification transistor (a FET for amplification) comprising a N channel FET whose gate electrode is connected to the amplifier output terminal 35 and whose source electrode is connected to the line of the ground voltage as the lower voltage power source (a ground voltage). The reference number 38 denotes a transistor for limiting an amplification factor comprising a N channel FET whose gate and drain electrodes are connected to the drain electrode of the first amplifier transistor 37, and whose source electrode is connected to the line of the ground voltage as the low voltage power source. The reference number 39 designates a first current source transistor (a current source FET) comprising a P channel FET placed between the drain electrodes of the two transistors 37 and 38 and the signal line of the voltage of the high voltage power source. The reference number 40 designates a second amplification transistor (an amplification FET) comprising a N channel FET whose gate electrode is connected to the drain electrode of the first amplification transistor 37 and whose source electrode is connected to the line of the voltage of the low voltage power source. The reference number 41 designates a second current source transistor (a current source FET) comprising a P channel FET placed between the drain electrode of the second amplification transistor 40 and the line of the voltage VCC of the high voltage power source. The reference number 42 designates a third amplification transistor (an amplification FET) comprising a N channel FET whose gate electrode is connected to the drain electrode of the second amplification transistor 40 and whose source electrode is connected to the line of the voltage of the low voltage power source. The reference number 43 designates a third current source transistor (a current source FET) comprising a P channel FET placed between the drain electrode of the third amplification transistor 42 and the line of the voltage VCC of the high voltage power source. The drain electrode of the third amplification transistor 42 is connected to the amplifier output terminal 36.

The reference number 45 designates a first constant current source comprising a N channel FET whose gate electrode is connected to a constant voltage power source (omitted from the drawings) and whose source electrode is connected to the line of the voltage of the low voltage power source (a ground voltage). The reference number 44 denotes a second constant current source comprising a N channel FET placed between the drain electrode of the first constant current source transistor 45 and the line of the voltage of the high voltage power source. The gate electrode of the second current source transistor is connected to the drain electrode thereof. The second constant current source transistor 44 supplies the voltage to each gate electrode of the current source transistors 39, 41, and 43.

Because the amplification circuit 28 having the configuration described above in which three pairs of the amplification transistors and the current source transistors are connected in three stages in series, it is possible to output the output voltage to the amplification output terminal 36. This output voltage has been obtained by amplifying the input voltage by the inverter in each of the three stages. Because the output of the inverter in the first stage is connected to the amplification factor limiting transistor 38 connected to both the first amplification transistor 37 and the first current source transistor 39, so that the amplification factor of the amplification inverter in the first stage is limited by 1, the input voltage is amplified by the following two inverters in the second and third stages. Because other internal configuration and components in the first and second level shift circuits 3 and 4 and each of the switching circuits 25, 27, 31, and 33 are the same of those in the second embodiment, the same reference numbers will be used for those components, and the explanation of those components is therefore omitted here for brevity.

Next, a description will be given of the entire operation of the switched capacitor filter as the third embodiment.

In the following explanation, each of the switching circuits 25, 27, 31, and 33 connects each of the capacitors 26 and 32 to the signal lines, respectively, only when the level of the switching control signal is the H level, and connects each of the capacitors 26 and 32 to the line of the high voltage power source only when the level of the switching control signal is the L level. However, the present invention is not limited by this condition.

First, when the level of the switching control signal is the L level, all of the switching circuits 25, 27, 31, and 33 connect the capacitors 26 and 32 to the line of the voltage VCC, both terminals of each of the input capacitor 26 and the limit capacitor 32 are completely shorted and completely discharged.

In this situation, when the level of the switching circuit is changed to the H level from the L level, all of the switching circuits 25, 27, 31, and 33 connect the capacitors 26 and 32 to the signal lines. Thereby, in the input capacitor 26, a charging current flows. The magnitude of this charging current corresponds to the voltage difference between the input voltage and the voltage of the input connection node 53. This charging current flows until the voltage difference becomes zero. Furthermore, in the limit capacitor 32, a charging current flows. The magnitude of this charging current corresponds to the voltage difference between the voltage of the input connection node 53 and the voltage of the output connection node 53. This charging current flows until this voltage difference becomes zero. Accordingly, those two capacitors 26 and 32 become the circuits where the charging current flows per one period of the switching control signal by the switching operation of each of the switching circuits 25, 27, 31, and 33 connected to respective terminals of the capacitors 26 and 32. Thereby, those two capacitors 26 and 32 act as resistance against an input signal whose frequency is adequately lower than the frequency of the switching control signal.

Figure 12:
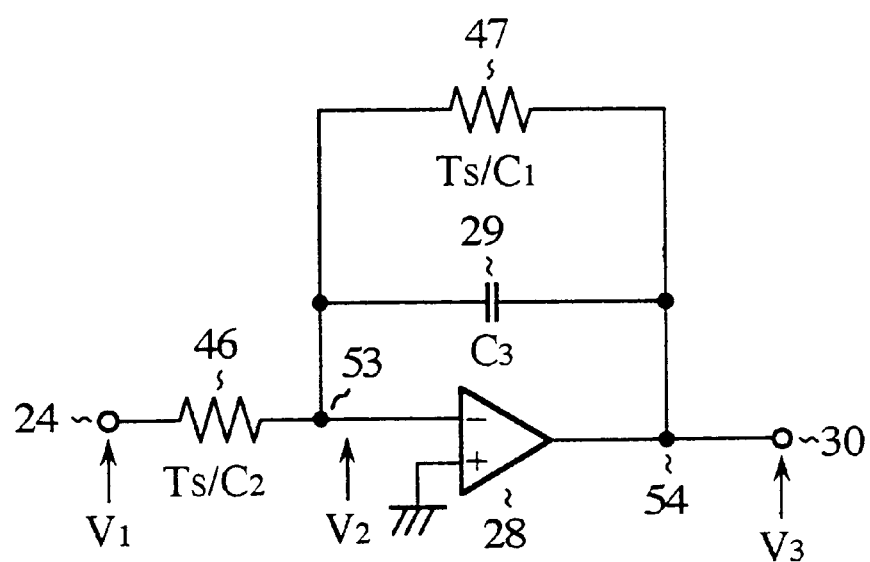
FIG. 12 is a block diagram showing an equivalent circuit of the switched capacitor filter as the third embodiment of the present invention shown in FIG. 10.

FIG. 12 is a block diagram showing an equivalent circuit of the switched capacitor filter as the third embodiment when the frequency of the switching control signal is adequately higher than the frequency of the input signal. In FIG. 12, the reference number 46 designates an input equivalent resistance as an equivalent circuit of the input capacitor 26. The reference number 47 denotes an equivalent limit resistance as an equivalent of the limit capacitor 32.

Because other configurations and components in the switched capacitor filter are the same of those in the switched capacitor filter shown in FIG. 10, the same reference numbers will be used for those components, and the explanation of those components is therefore omitted here for brevity.

In this equivalent circuit for the switched capacitor filter, when the level of the voltage V1 of the input signal is increased, an input current I1 flows. This input current I2 is obtained by dividing the input equivalence resistance 46 (Ts/C2) by the voltage difference between the input voltage V1 and the voltage V2 at the input connection node 53. This input current I2 flows into one terminal of each of the fixed capacitor 29 and the limit equivalence resistance 47 (Ts/C1) so as to charge the fixed capacitor 29. In this case, the amplifier circuit 28 supplies capacitors to other terminal of the fixed capacitor 29. As a result, amplified input voltage having an opposite polarity when compared with the polarity of the input signal is outputted as the output voltage V3 according to the magnitude of the charged voltage of the fixed capacitor 29.

For example, when the capacity of the input capacitor is C2, the capacity of the limit capacitor 32 is C1, and one period of the switching control signal is Ts, the resistance value of the input equivalence resistance 46 becomes Ts/C2, and the resistance value of the limit equivalence resistance 47 becomes Ts/C1. This switched capacitor filter has the characteristic of a first order low pass filter, the amplification factor thereof becomes C2/C1, and a cutoff frequence fc becomes the following value:

$$fc = fs/(2\pi \cdot C3/C1) \tag{1}$$

As described above, according to the third embodiment of the present invention, the two level shift circuits 3 and 4 generate the internal switching signal B and the inverted internal switching signal $\overline{B}$ based on the switching control signal A. The amplitude of each of the internal switching signal B and the inverted internal switching signal $\overline{B}$ is greater than the amplitude of the switching control signal A, and those amplified internal switching signals are provided to each of the switching circuits 25, 27, 31, and 33. The voltages generated by the level shift circuits 3 and 4 are lower than the forward voltage of the diode formed between the semiconductor substrate and the N channel FET. It is thereby possible to prevent flowing of a current through the semiconductor substrate, and to reduce the level of the voltage power source when compared with the conventional one. Accordingly, the switched capacitor filter may be fabricated by CMOS processes and may operate under the voltage of a power source that is lower than the sum voltage of the two threshold voltages, it is difficult for conventional circuits to perform under this voltage. In addition to this function, because the switched capacitor filter of the third embodiment may perform without generating any ON resistance in each of the switching elements 6 and 7, it is possible to reduce the power consumption under the operation with certainly Specifically, in the third embodiment, because the amplifier circuit 28 has the configuration in which inverters forming transistors are arranged in two stages, it is possible to eliminate the limiting factor caused by the amplifier circuit 28 in order to decrease the voltage of the power source. For example, even if each of the threshold voltages of two transistors are 1.0 V, it is possible to set the voltage of the voltage power source to 1.6 V.

As set forth above, according to the present invention, the switching circuit has the configuration in which a forward switching circuit comprising a P channel FET and a N channel FET, whose source electrodes are connected to each other, and whose drain electrodes are also connected to each other, a first level shift circuit for receiving a switching control signal and for generating an internal switching signal whose phase is equal to a phase of the switching control signal and whose amplitude is larger than an amplitude of the switching control signal, and a second level shift circuit for receiving the switching control signal and for generating an inverted internal switching signal whose phase is an opposite phase to the phase of the switching control signal, and whose amplitude is larger than the amplitude of the switching control signal. In the above switching circuit, the internal switching signal is inputted to a gate electrode of one FET in the P channel FET and the N channel FET in the forward switching element, and the inverted internal switching signal is inputted to a gate electrode of other FET in the P channel FET and the N channel FET in the forward switching element. Accordingly, it may be so set that the voltage difference between voltages to be supplied to the gate electrodes of the two FETs in the forward switching element may be greater than the voltage difference between the H level and the L level of the switching control signal. Therefore, even if the amplitude of the switching control signal is in the amplitude of the voltage power source whose voltage is not more than the sum voltage of threshold voltages of the two FETs in the forward switching element, it is possible to generate an actual voltage difference, that is not less than the sum voltage of the threshold voltages of the two FETs by the two level shift circuits, to be supplied to the gate electrodes of the two FETs in the froward switching element. As a result, it is possible to reduce the voltage potential of the power source by the voltage increased by the level shift circuits, so that it is possible to perform the switching circuit under a lower voltage power source and to reduce the power consumption.

In addition, according to the present invention, because the switching circuit further comprises an inverse switching element comprising a P channel FET and a N channel FET, whose source electrodes are connected to each other and whose drain electrodes are connected to each other. In the above switching circuit, in the inverse switching element, the internal switching signal is inputted to a gate electrode of one FET, in different channel from one FET in the forward switching element, in the P channel FET and the N channel FET in the forward switching element, and the inverted internal switching signal is inputted to a gate electrode of other FET, it is also in different channel from other FET in the forward switching element, in the P channel FET and the N channel FET in the forward switching element. Therefore it is possible to provide the switching circuit having three terminals that may be driven under a voltage that is not more than the sum voltage of the threshold voltages of the two FETs.

Furthermore, according to the present invention, for example, it is possible to form each of the first level shift circuit and the second level shift circuit comprising a shift voltage generation circuit for generating a shift voltage based on a voltage of a voltage power source, a shift capacitor to be charged by the shift voltage generation circuit according to the shift voltage, a charging switch circuit for connecting the shift capacitor to the shift voltage generation circuit, a shift output voltage generation circuit for generating a shift output voltage by connecting one terminal of the shift capacitor to the voltage power source when the shift capacitor is electrically disconnected from the shift voltage generation circuit according to the switching control signal, and an internal switching signal generation circuit for generating an internal switching signal and an inverted internal switching signal by using the shift output voltage and the voltage of the voltage power source according to the switching control signal.

Moreover, according to the present invention, the shift output voltage generation circuit comprises a field effect transistor, and the shift voltage generation circuit generates the shift output voltage that is smaller in magnitude than a forward voltage generated in a diode formed between the field effect transistor and a semiconductor substrate. Thereby, it is possible to fabricate and to integrate the switching circuit on a semiconductor substrate. In this case, it is possible to prevent that the diode becomes ON by the shift voltage and to prevent flowing of a large current through the semiconductor substrate. As a result, it is also possible to prevent causing of electric breakdown of the semiconductor substrate and to avoid generating of noises.

In addition, according to the present invention, a switched capacitor filter has the configuration in which an input terminal for receiving an input signal, an amplifier for amplifying the input signal, for inverting the amplified input signal, and for outputting the inverted amplified input signal to an output terminal of the switched capacitor filter, a fixed capacitor placed in parallel to the amplifier between the input terminal and the output terminal, an input capacitor placed at a signal line between the input terminal and the output terminal and placed at an upper stream side observed from the fixed capacitor and the amplifier on the signal line, and the switching circuit as claimed in claim 1 for switching an electrical connection of the input capacitor to one of the amplifier and a first voltage power source. Therefore it is possible to drive the switched capacitor filter under a lower voltage power source that can not drive a conventional switched capacitor filter.

According to the present invention, specifically, the amplifier comprises a plurality of amplification inverters connected in series in odd-number stages placed on the signal line between the input terminal and the output terminal. Each of the plurality of amplification inverters forming the amplifier comprises an amplification field effect transistor whose source electrode is connected to the first voltage power source and whose gate electrode inputs the input signal or a signal corresponding to the input signal, and a current source field effect transistor placed between the drain electrode of the amplification field effect transistor and a second voltage power source, for limiting a magnitude of a current flowing through the amplification field effect transistor. Therefore it is possible to eliminate the limiting factor to prevent reducing of the voltage caused by the amplifier. In addition, it is possible to drive the switched capacitor filter under at least the sum voltage of the threshold voltages of the P channel FET and the N channel FET. Further, for example, even if each of the threshold voltages of those two FETs is 1.0 V, it is possible to drive the switched capacitor filter under the voltage of 1.6 V.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A switching circuit comprising:

a forward switching element comprising a first P channel field effect transistor (FET) and a first N channel FET, having source electrodes connected to an input terminal of said forward switching element, and having drain electrodes connected to an output terminal of said forward switching element;

an inverse switching element comprising a second P channel FET and a second N channel FET, having source electrodes connected to said output terminal of said forward switching element, and having drain electrodes connected to an output terminal of said inverse switching element;

a first level shift circuit for receiving a switching control signal and for generating an internal switching signal in phase with the switching control signal and larger in amplitude than the switching control signal, wherein the internal switching signal is inputted to a gate electrode of one of said first P channel FET and said first N channel FET in said forward switching element, and the internal switching signal is inputted to a gate electrode on one of said second P channel FET and said second N channel FET in said inverse switching element; and a second level shift circuit for receiving the switching control signal and for generating an inverted internal switching signal opposite in phase from the switching control signal, and larger in amplitude than the switching control signal, wherein the inverted internal switching signal is inputted to a gate electrode of one of said first P channel FET and said first N channel FET in said forward switching element, and the inverted internal switching signal is inputted to a gate electrode of one of said second P channel FET and said second N channel FET in said inverse switching element, the internal switching signal being applied to gate electrodes of FETs in said forward switching element and in said inverse switching element having opposite channel polarities, and the inverted internal switching signal being applied to gate electrodes of FETs in said forward switching element and in said inverse switching element having opposite channel polarities.

2. The switching circuit as claimed in claim 1, wherein each of said first level shift circuit and said second level shift circuit comprises:
- a shift voltage generation circuit for generating a shift voltage based on a voltage of a first voltage power source;
- a shift capacitor charged by said shift voltage generation circuit;
- a charging switch circuit for connecting said shift capacitor to said shift voltage generation circuit;
- a shift output voltage generation circuit for generating a shift output voltage by connecting one terminal of said shift capacitor to a second voltage power source when said shift capacitor is electrically disconnected from said shift voltage generation circuit according to the switching control signal; and
- an internal switching signal generation circuit for generating the internal switching signal and the inverted internal switching signal using the shift output voltage and the voltage of said second voltage power source according to the switching control signal.

3. The switching circuit as claimed in claim 2, wherein said shift output voltage generation circuit comprises a semiconductor substrate including a field effect transistor, and said shift output voltage generation circuit generates the shift output voltage, the shift output voltage being smaller in magnitude than a forward voltage of a diode formed within said semiconductor substrate between said field effect transistor of said shift output voltage generation circuit and said semiconductor substrate.

4. A switched capacitor filter comprising:
- an input terminal for receiving an input signal;
- an output terminal;
- an amplifier for amplifying the input signal supplied to an input of said amplifier, for inverting the amplified input signal, and for outputting the inverted amplified input signal to said output terminal of the switched capacitor filter;
- a fixed capacitor connected between said input of said amplifier and said output terminal;
- first, second, third, and fourth switches switching in response to an internal switching signal and an inverted internal switching signal;
- a first switched capacitor connected by said first switch to said input terminal and by said second switch to said input of said amplifier;
- a second switched capacitor connected by said third switch to said input of said amplifier and by said fourth switch to said output terminal; and
- a switching circuit for generating the internal switching signal and the inverted internal switching signal for switching said first and second switches between connection (i) of said first switched capacitor to said input terminal and said input of said amplifier and (ii) of said first and second switches to a first voltage power source, and for switching said third and fourth switches between connection (i) of said second switched capacitor in parallel with said fixed capacitor and (ii) of said third and fourth switches to the first voltage power source, each of said switching circuits comprising:
  - a forward switching element comprising a first P channel field effect transistor (FET) and a first N channel FET, having source electrodes connected to an input terminal of said forward switching element, and having drain electrodes connected to an output terminal of said forward switching element;
  - an inverse switching element comprising a second P channel FET and a second N channel FET, having source electrodes connected to said output terminal of said forward switching element, and having drain electrodes connected to an output terminal of said inverse switching element;
  - a first level shift circuit for receiving a switching control signal and for generating the internal switching signal in phase with the switching control signal and larger in amplitude than the switching control signal, wherein the internal switching signal is inputted to a gate electrode of one of said first P channel FET and said first N channel FET in said forward switching element, and the internal switching signal is inputted to a gate electrode on one of said second P channel FET and said second N channel FET in said inverse switching element; and
  - a second level shift circuit for receiving the switching control signal and for generating the inverted internal switching signal opposite in phase from the switching control signal, and larger in amplitude than the switching control signal, wherein the inverted internal switching signal is inputted to a gate electrode of one of said first P channel FET and said first N channel FET in said forward switching element, and the inverted internal switching signal is inputted to a gate electrode of one of said second P channel FET and said second N channel FET in said inverse switching element, the internal switching signal being applied to gate electrodes of FETs in said forward switching element and in said inverse switching element having opposite channel polarities, and the inverted internal switching signal being applied to gate electrodes of FETs in said forward switching element and in said inverse switching element having opposite channel polarities.

5. The switched capacitor filter as claimed in claim 4, wherein said amplifier comprises:
- an amplification field effect transistor having a source electrode connected to said first voltage power source and having a gate electrode receiving an input signal; and
- a current source field effect transistor connected between said drain electrode of said amplification field effect transistor and a second voltage power source, for limiting current flowing through said amplification field effect transistor.

* * * * *